US010390468B2

(12) United States Patent
Jeong

(10) Patent No.: US 10,390,468 B2
(45) Date of Patent: Aug. 20, 2019

(54) WIRELESS POWER-TRANSMISSION SHIELD

(71) Applicant: Qualcomm Incorporated, San Diego, CA (US)

(72) Inventor: Seong Heon Jeong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 124 days.

(21) Appl. No.: 15/687,237

(22) Filed: Aug. 25, 2017

(65) Prior Publication Data
US 2019/0069452 A1    Feb. 28, 2019

(51) Int. Cl.
| H02J 7/00 | (2006.01) |
| H05K 9/00 | (2006.01) |
| H02J 50/12 | (2016.01) |
| H02J 7/02 | (2016.01) |
| H04B 5/00 | (2006.01) |
| H02J 50/10 | (2016.01) |
| H02J 50/20 | (2016.01) |

(Continued)

(52) U.S. Cl.
CPC .......... *H05K 9/0081* (2013.01); *H02J 7/0042* (2013.01); *H02J 7/025* (2013.01); *H02J 50/05* (2016.02); *H02J 50/10* (2016.02); *H02J 50/12* (2016.02); *H02J 50/20* (2016.02); *H02J 50/70* (2016.02); *H04B 5/0037* (2013.01); *H04B 5/0075* (2013.01)

(58) Field of Classification Search
USPC ....................................................... 320/108
See application file for complete search history.

(56) References Cited

U.S. PATENT DOCUMENTS

| 2005/0274932 A1* | 12/2005 | Knight ................. B29C 70/882 |
| | | 252/500 |
| 2011/0140653 A1* | 6/2011 | Jung ....................... H02J 50/12 |
| | | 320/108 |

(Continued)

FOREIGN PATENT DOCUMENTS

| EP | 2750145 A1 | 7/2014 |
| KR | 20170010734 | 2/2017 |

OTHER PUBLICATIONS

International Search Report and Written Opinion—PCT/US2018/044689—ISA/EPO—dated Oct. 16, 2018.

*Primary Examiner* — Samuel Berhanu
(74) *Attorney, Agent, or Firm* — Colby Nipper

(57) ABSTRACT

The present disclosure describes aspects of a wireless power-transmission shield for a wireless charger. The wireless charger includes a wireless power transmitter configured to generate an alternating magnetic field at a charging frequency. As a result of the alternating magnetic field, a spurious electromagnetic field is further generated at a spurious frequency different than the charging frequency. The wireless charger includes a shield having an associated conductivity or an associated impedance. The shield is configured to be substantially transparent to the alternating magnetic field based on the charging frequency and the associated conductivity of the shield or the associated impedance of the shield. The shield is further configured to be lossy to the spurious electromagnetic field based on the spurious frequency and the associated conductivity of the shield or the associated impedance of the shield.

30 Claims, 12 Drawing Sheets

(51) Int. Cl.
*H02J 50/05* (2016.01)
*H02J 50/70* (2016.01)

(56) References Cited

U.S. PATENT DOCUMENTS

| | | |
|---|---|---|
| 2013/0257362 A1 | 10/2013 | Lim et al. |
| 2014/0125278 A1 | 5/2014 | Kim et al. |
| 2014/0266018 A1* | 9/2014 | Carobolante ........... H02J 7/025 |
| | | 320/108 |
| 2015/0123604 A1 | 5/2015 | Lee et al. |
| 2015/0263570 A1 | 9/2015 | Van Goor et al. |
| 2015/0280450 A1 | 10/2015 | Park et al. |
| 2015/0366111 A1* | 12/2015 | Yagi ........................ H02M 1/44 |
| | | 174/350 |
| 2016/0035477 A1 | 2/2016 | Yeh et al. |
| 2016/0087456 A1 | 3/2016 | Shizuno et al. |
| 2016/0118836 A1* | 4/2016 | Waldschmidt .......... H02J 7/025 |
| | | 320/108 |

\* cited by examiner

1300

1302

Generate an alternating magnetic field at a charging frequency to wirelessly transfer power to the receiver device, a spurious electromagnetic field being further generated as a result of the alternating magnetic field

1304

Attenuate the spurious electromagnetic field while not substantially attenuating the alternating magnetic field using a shield having an associated conductivity

FIG. 13

WIRELESS POWER-TRANSMISSION SHIELD

FIELD OF THE DISCLOSURE

The present disclosure relates generally to wireless power transfer, and more specifically to devices and methods for shielding spurious electromagnetic fields during wireless charging.

BACKGROUND

This description of related art is provided for the purpose of generally presenting a context for the disclosure that follows. Unless indicated otherwise herein, concepts described in this section are not prior art to this disclosure and are not admitted to be prior art by inclusion herein.

Wireless charging systems are becoming more common for charging receiver devices. By transferring power in free space (e.g., via an alternating magnetic field), these wireless charging systems eliminate charging cables or other similar connectors that physically connect to the receiver devices to transfer power. Transferring power via an alternating magnetic field, however, produces a spurious electromagnetic field, which can cause electromagnetic and radio frequency interference. This interference can increase noise and decrease sensitivity of various components in the receiver devices, such as communication antennas. As a result, reliability of the receiver devices can decrease near the wireless charging systems, which can discourage use of the wireless charging systems.

Shields can isolate devices from spurious electromagnetic fields. These shields, however, are made of conductive materials (e.g., copper, aluminum) or magnetic materials (e.g., ferrite) that can affect the alternating magnetic field produced by the wireless charging system and degrade performance of the wireless charging system. As a result, certain shields can decrease efficiency of the wireless charging system or prevent the wireless charging system from transferring power to receiver devices.

SUMMARY

In some aspects of a wireless power-transmission shield, a wireless charger includes a wireless power transmitter configured to generate an alternating magnetic field at a charging frequency to wirelessly transfer power to a receiver device. As a result of the alternating magnetic field, a spurious electromagnetic field is further generated at a spurious frequency different than the charging frequency. The wireless charger also includes a shield having an associated conductivity. The shield is disposed between the wireless power transmitter and a charging region. The shield is configured to be substantially transparent to the alternating magnetic field based on the charging frequency and the associated conductivity of the shield. The shield is further configured to be lossy to the spurious electromagnetic field based on the spurious frequency and the associated conductivity of the shield.

Some aspects of a wireless power-transmission shield involve a system for wirelessly charging a receiver device. The system includes a wireless power transmitter to generate an alternating magnetic field at a charging frequency. A spurious electromagnetic field is further generated as a result of the alternating magnetic field. The spurious electromagnetic field has a different spurious frequency than the charging frequency. The system further includes a shield having an associated impedance. The shield is disposed between the wireless power transmitter and a charging region. The shield is configured to be substantially transparent to the alternating magnetic field based on the charging frequency and the associated impedance of the shield. The shield is further configured to be lossy to the spurious electromagnetic field based on the spurious frequency and the associated impedance of the shield.

In other aspects, a method for wirelessly charging a receiver device comprises generating an alternating magnetic field at a charging frequency to wireless transfer power to the receiver device. As a result of the alternating magnetic field, a spurious electromagnetic field is further generated at a spurious frequency different than the charging frequency. The method further comprises attenuating the spurious electromagnetic field while not substantially attenuating the alternating magnetic field using a shield having an associated conductivity. The attenuating of the spurious electromagnetic field is based on the spurious frequency and the associated conductivity of a shield. The not substantially attenuating of the alternating magnetic field is based on the charging frequency and the associated conductivity of the shield.

In some aspects, an apparatus for wirelessly charging a receiver device comprises a wireless power transmitter for generating an alternating magnetic field at a charging frequency to wirelessly transfer power to the receiver device. As a result of the alternating magnetic field, a spurious electromagnetic field is further generated at a spurious frequency different than the charging frequency. The apparatus further comprises a means for attenuating the spurious electromagnetic field based on the spurious frequency and an associated impedance while not substantially attenuating the alternating magnetic field based on the charging frequency and the associated impedance.

BRIEF DESCRIPTION OF THE DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements:

FIG. 13 depicts a flowchart of an example method for wireless power-transmission shielding based on an associated conductivity.

DETAILED DESCRIPTION

Wireless charging systems are becoming more common for charging a receiver device. By transferring power in free space (e.g., via an alternating magnetic field), these wireless charging systems eliminate charging cables that physically connect to the receiver device to transfer power. Transferring power via an alternating magnetic field, however, produces a spurious electromagnetic field, which can cause electromagnetic and radio frequency interference. These wireless charging systems need a shield that protects the receiver device from the spurious electromagnetic field while enabling the alternating magnetic field to wirelessly transfer power to the receiver device. Furthermore, the effectiveness of the shield should be valid for an entire charging region, so as to provide additional freedom in positioning one or more receiver devices for wireless charging.

This disclosure describes aspects of utilizing a shield in a wireless charger. The apparatuses and methods described herein shield a receiver device from a spurious electromagnetic field during wireless charging. In particular, the shield is substantially transparent to the alternating magnetic field and simultaneously lossy to the spurious electromagnetic field. In some aspects, the transparency and lossiness of the shield is based on an associated conductivity of the shield. In other aspects, the transparency and lossiness of the shield is based on an associated impedance of the shield. The shield enables wireless charging to occur without degrading performance of the receiver device.

These and other aspects of a wireless power-transmission shield are described below in the context of an example environment, example arrangements and configurations of the wireless power-transmission shields in a wireless charger, and techniques. Any reference made with respect to the example environment or wireless chargers, or elements thereof, is by way of example only and is not intended to limit any of the aspects described herein.

Example Environment

Figure 1:
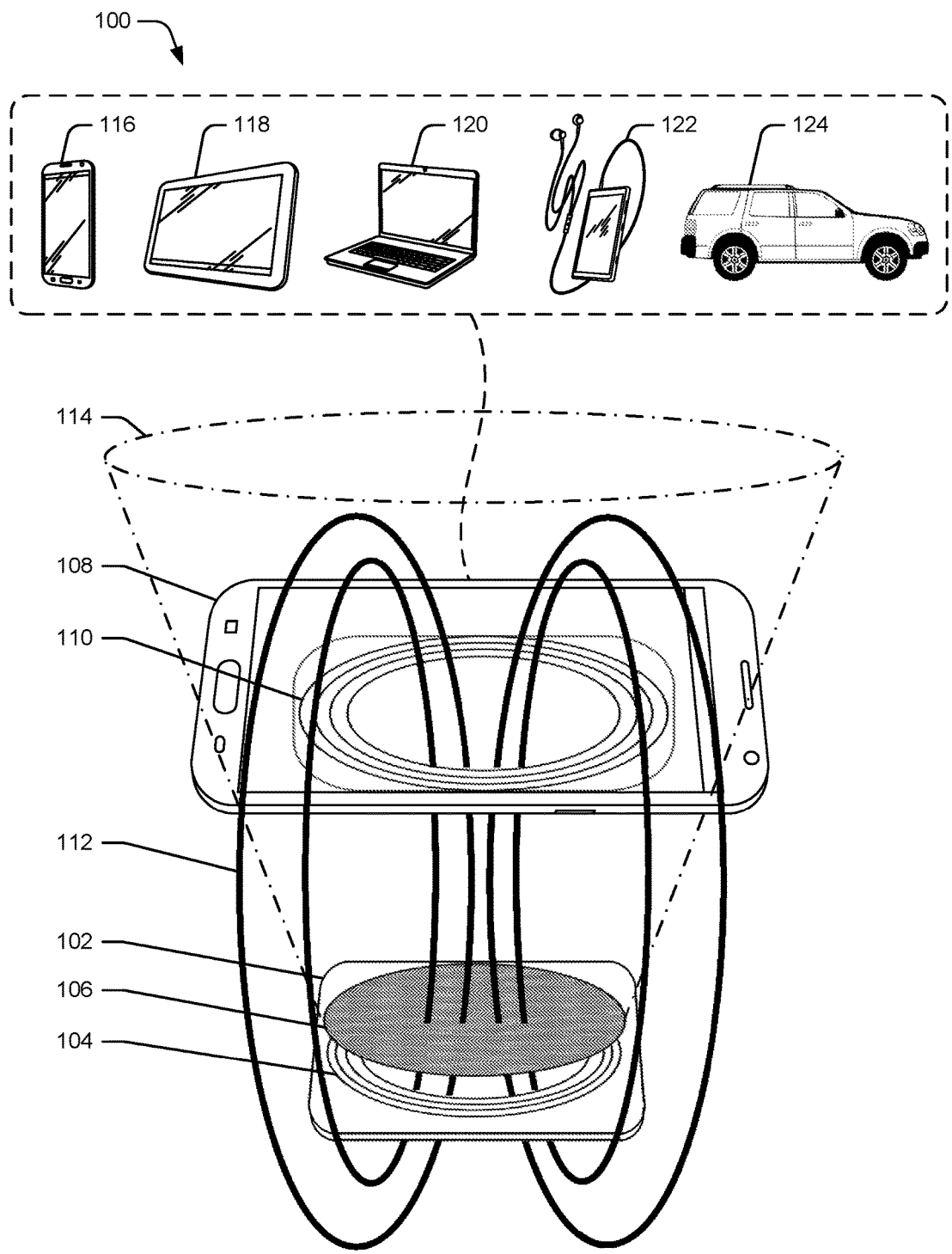
FIG. 1 is an example implementation of a wireless charging system.

FIG. 1 is an example implementation of a wireless charging system 100, which includes a wireless charger 102 having a wireless power transmitter 104 and a shield 106. The wireless charging system 100 also includes a receiver device 108 having a wireless power receiver 110. An alternating magnetic field 112 is generated by the wireless power transmitter 104 in order to wirelessly transfer power to the receiver device 108 positioned within a charging region 114 of the wireless charger 102. The receiver device 108 can be embodied as any suitable type of device including, a mobile phone 116, a tablet 118, a laptop computing device 120, headphones 122, and a vehicle 124.

The wireless power transmitter 104 is configured to wirelessly transmit power at a level sufficient to charge the receiver device 108. For example, the power level provided wirelessly may be on the order of watts (W) to kilowatts (kW) (e.g., 1 W to 5 W for charging a mobile phone, 1 kW to 110 kW for charging a vehicle). The wireless power transmitter 104 is configured to generate the alternating magnetic field 112 at a charging frequency suitable to wirelessly charge the receiver device 108. The charging frequency may be on the order of kilohertz (kHz) to megahertz (MHz) (e.g., between 80 kHz and 300 kHz, or 6.78 MHz).

As a result of the alternating magnetic field, the spurious electromagnetic field (not shown) is generated. The spurious electromagnetic field is generated at a spurious frequency different from the charging frequency. For example, the spurious frequency can be lower than the charging frequency, higher than the charging frequency, or outside a range of charging frequencies. The spurious frequency may be on the order of kilohertz (kHz) to gigahertz (GHz) (e.g., at least two times greater than the charging frequency, frequencies greater than 12 MHz, electromagnetic interference frequencies between 30 MHz and 1 GHz, radio frequency interference frequencies greater than 1 GHz). The spurious frequency may be at one or more harmonics of the charging frequency. Further, the spurious electromagnetic field can be a single spurious electromagnetic field at a single spurious frequency or multiple spurious electromagnetic fields at multiple distinct spurious frequencies.

Without shielding, the spurious electromagnetic fields can degrade performance of the receiver device 108, specifically with respect to components in the receiver device 108 that are susceptible to the spurious frequency. Through electromagnetic coupling between the wireless power transmitter 104 and the components in the receiver device 108, the spurious electromagnetic field induces a voltage at the spurious frequency, which generates noise and degrades performance of the components in the receiver device 108. Furthermore, another spurious electromagnetic field at another spurious frequency can be generated at the receiver device 108 based on the spurious electromagnetic field. Coupling between components in the receiver device 108 and the wireless power transmitter 104 may refer to capacitive coupling, inductive coupling, and/or radiated coupling.

Figure 2:
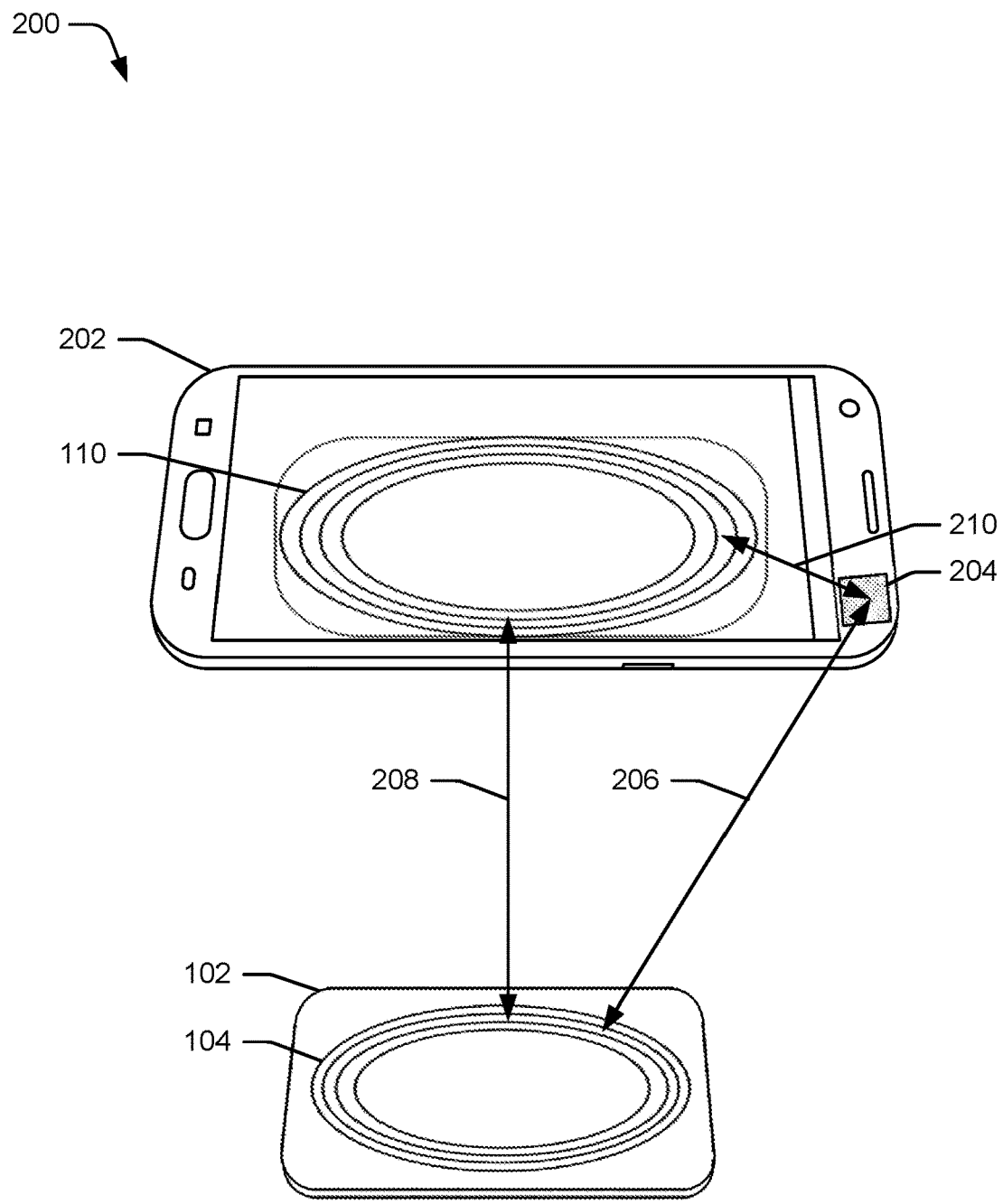
FIG. 2 illustrates example coupling paths in a wireless charging system.

FIG. 2 illustrates example coupling paths in a wireless charging system 200. The depicted configuration includes a receiver device 202 having a communication antenna 204 and the wireless power receiver 110 of FIG. 1. The depicted configuration also includes the wireless charger 102 and wireless power transmitter 104 of FIG. 1. The communication antenna 204 can be used by the receiver device 202 to support wireless communications such as Wi-Fi™, Bluetooth™, radio, television broadcasting, cellular communications, satellite communications, and so forth.

As illustrated in FIG. 2, direct and indirect coupling paths can exist between the wireless power transmitter 104 and the communication antenna 204. For example, the wireless power transmitter 104 can directly couple with the communication antenna 204 through coupling path 206. Also, the wireless power transmitter 104 can indirectly couple to the communication antenna 204 through the wireless power receiver 110 using coupling path 208 and then coupling path 210. As another example, a rectifier circuit (not shown) in the receiver device 202 can generate another spurious electromagnetic field at a harmonic of the spurious frequency and the other spurious electromagnetic field can be reflected back to the wireless power transmitter 104 and the communication antenna 204 along coupling path 208 and then coupling path 206.

As described above, the spurious electromagnetic field can degrade performance of the communication antenna 204 by decreasing a sensitivity of the communication antenna 204. For example, the spurious frequency of the spurious electromagnetic field can correspond to a communication frequency between 700 GHz to 2600 GHz. As a result, the spurious electromagnetic field can cause the communication antenna 204 to fail to transmit and/or receive communications. As another example, the spurious electromagnetic field can reduce a quality of the communications transmitted and/or received by the communication antenna 204. In order to reduce the effect of the spurious electromagnetic field on the receiver device 108 and reduce electromagnetic coupling between the wireless power transmitter 104 and the components of the receiver device 108 at the spurious frequency, the wireless charger 102 includes the shield 106, as shown in FIG. 1.

The shield 106 is configured to be substantially transparent to the alternating magnetic field 112 at the charging frequency. The transparency of the shield 106 enables the alternating magnetic field 112 to propagate (e.g., pass) through the shield 106 and transfer power to the wireless power receiver 110. Due to the substantial transparency of the shield 106, a mutual inductance between the wireless power transmitter 104 and the wireless power receiver 110 is minimally reduced (e.g., unaffected). For example, the mutual inductance between the wireless power transmitter 104 and the wireless power receiver 110 may decrease by 5% (e.g., from 300 millihenries to 285 millihenries) due to the shield 106. In other words, the transparency of the shield 106 does not substantially attenuate the alternating magnetic field 112. The attenuation of the alternating magnetic field 112 due to the shield can be, for example, less than one decibel or smaller than an attenuation of the spurious electromagnetic field. Accordingly, the substantial transparency of the shield 106 enables the alternating magnetic field 112 to perform similarly to when the shield 106 is not present in the wireless charger 102.

In addition to being substantially transparent to the alternating magnetic field 112, the shield 106 is configured to be lossy to the spurious electromagnetic field. In other words, the lossiness of the shield 106 attenuates the spurious electromagnetic field effective to shield the receiver device 108 from the electromagnetic field and reduce interference at the receiver device 108. For example, the attenuation of the spurious electromagnetic field can be on the order of decibels (dB) (e.g., at least 3 dB, at least 8 dB, larger than an attenuation of the alternating magnetic field).

The shield 106 allows the alternating magnetic field 112 to pass though and transfer power to the wireless power receiver 110 when the receiver device 108 is in the charging region 114 of the wireless charger 102. The charging region 114 is configured to receive the receiver device 108 for wireless charging. The charging region 114 can be a spatial region defined with respect to a maximum distance and maximum angle relative to the wireless power transmitter 104 and/or a physical region on a planar surface of the wireless charger 102 upon which the receiver device 108 can be placed. As an example, the charging region 114 can be on the order of centimeters (cm) from the wireless power transmitter 104 (e.g., between 4 cm to 10 cm).

The shield 106 is positioned between the wireless power transmitter 104 and the charging region 114 effective to shield the receiver device 108 from the spurious electromagnetic field. For example, the shield 106 is positioned on a plane substantially parallel to the wireless power transmitter 104 and positioned to intercept the spurious electromagnetic field before the spurious electromagnetic field reaches the receiver device 108. In other words, the shield 106 can be positioned perpendicular to the spurious electromagnetic field.

Dimensions of the shield 106 are effective to shield the receiver device 108 from the spurious electromagnetic field throughout the charging region 114. The dimensions of the shield 106 can be the same dimensions as the wireless power transmitter 104 or the same dimensions as a charging surface of the wireless charger 102. By shielding the charging region 114, the receiver device 108 may be positioned in a variety of locations, providing a user with more freedom in positioning the receiver device 108 and/or multiple receiver devices.

Figure 3:
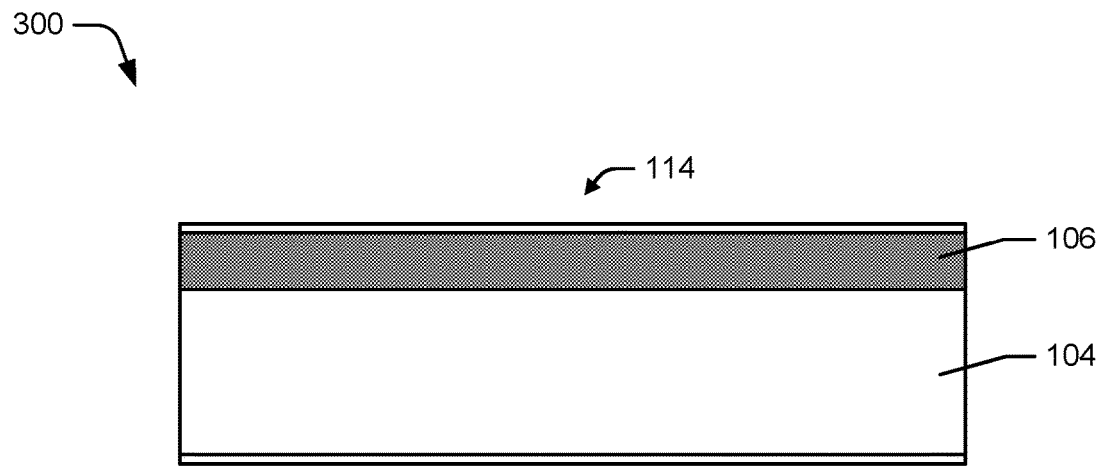
FIG. 3 illustrates an example configuration of the wireless charger shown in FIG. 1 in which a shield is positioned on one side of the wireless power transmitter.
Figure 4:
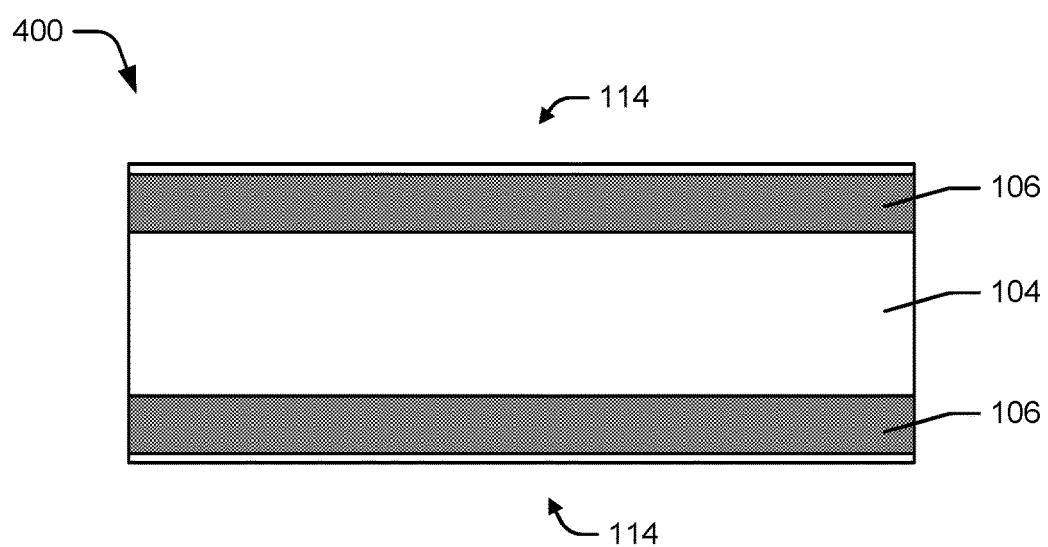
FIG. 4 illustrates another example configuration of the wireless charger shown in FIG. 1 in which a shield is positioned on opposite sides of the wireless power transmitter.

Example configurations of wireless chargers that utilize the shield 106 are illustrated in FIGS. 3-4. FIG. 3 is an example configuration of the wireless charger 102 shown in FIG. 1 in which the shield 106 and the charging region 114 are positioned on a same side of the wireless power transmitter 104 in accordance with one or more aspects at 300. In this way, the shield 106 can intersect the alternating magnetic field 112 and the spurious electromagnetic field before the alternating magnetic field 112 and the spurious electromagnetic field reach the receiver device 108 positioned in the charging region 114. A dielectric layer can also be positioned between the shield 106 and the charging region 114 in order to separate the shield 106 from an exterior housing of the wireless charger 102, as described in further detail below.

In the depicted configuration, the charging region 114 and the shield 106 are shown to be above the wireless power transmitter 104. Assuming the wireless charger 102 is placed on a table, a user can charge the receiver device 108 by positioning the receiver device 108 above the wireless charger 102 (e.g., placing the receiver device 108 on a top surface of the wireless charger 102). Although not explicitly depicted, the charging region 114 and the shield 106 can alternatively be below the wireless power transmitter 104. Assuming that the wireless charger 102 is placed on a desk such that the charging region 114 is below the wireless power transmitter 104, the user can charge the receiver device 108 in a pant pocket by sitting at the desk and positioning the receiver device 108 below the wireless charger 102.

FIG. 4 is another example configuration of the wireless charger 102 shown in FIG. 1 in which the shield 106 and the charging region 114 are positioned on both sides of the wireless power transmitter 104 in accordance with one or more aspects at 400. This enables the wireless charger 102 to be symmetric and provide shielding and wireless charging on either side of the wireless charger 102. In this example, the wireless charger 102 can charge a receiver device 108 that is above the wireless charger 102 as well as another receiver device 108 that is below the wireless charger 102.

The shield 106 can be configured to achieve the shielding performance described above via an associated conductivity or via an associated impedance. This document now turns to example types of shields that can be used to implement the shield 106 in FIGS. 1, 3, and 4.

Shielding Based on an Associated Conductivity

In some aspects, the shield 106 is a semiconductor having an associated conductivity between that of a conductor and an insulator (e.g., a low level of conductivity). For example, the associated conductivity may be on the order of Siemens per millimeter (S/mm) to Siemens per meter (S/m) (e.g., between 0.00001 and 100 S/m, between 0.0001 and 10 S/m). The shield 106 can be formed using materials having the low level of conductivity, such as silicon, beryllium oxide, polytetrafluoroethylene, acrylic, gallium arsenide, germanium, or an anti-static sheet. The shield 106 can also be formed by lightly or heavily doping a semiconductor effective to achieve the associated conductivity.

The shield 106 can be continuous (e.g., having no apertures, no holes, and no slots), such as a continuous layer of material or a planar sheet. Additionally, the shield 106 can be homogeneous in that the electrical properties of the shield 106 are consistent across the shield. Furthermore, the shield 106 can be non-magnetic, having a relative permeability ($\mu_r$) at or about one.

In order to achieve the performance described above, the associated conductivity of the shield 106 enables the shield 106 to resist and/or minimize the generation of eddy currents in the shield 106 at the charging frequency. In contrast, the associated conductivity of the shield 106 enables the shield 106 to generate eddy currents at the spurious frequency. In other words, the generation of eddy currents in the shield 106 are at a reduced level at the charging frequency compared to the generation of eddy currents at the spurious frequency. This performance is due to the shield 106 being a semiconductor and also because the associated conductivity changes with respect to the charging frequency and the spurious frequency, as shown in Equation 1 below:

$$\sigma = \sigma_S + j\omega \in'' \quad \text{Equation 1}$$

In Equation 1, the term $\sigma$ refers to the associated (e.g., effective) conductivity, the term $\sigma_S$ refers to a static or direct current conductivity of the shield 106, the term $\omega$ represents an angular frequency, and the term $\in''$ refers to an imaginary part of a permittivity of the shield 106. Accordingly, the associated conductivity is a complex number having a real part $\sigma_S$ and an imaginary part $\omega\in''$.

As shown in Equation 1, the associated conductivity is a function of frequency and increases as the frequency increases. Thus, when the spurious electromagnetic field has a spurious frequency higher than the charging frequency of the alternating magnetic field 112, the associated conductivity is higher and the shield 106 behaves more similarly to a conductor by allowing eddy currents to be induced at the spurious frequency. However, at the charging frequency, the associated conductivity of the shield 106 is lower and the shield 106 behaves more similarly to an insulator by resisting the generation of eddy currents at the charging frequency. As such, the alternating magnetic field 112 and the spurious electromagnetic field can be present at the same time and the associated conductivity of the shield 106 enables the shield 106 to be simultaneously transparent to the alternating magnetic field 112 and lossy to the spurious electromagnetic field.

In addition, a thickness of the shield 106 can be determined based the spurious frequency. For example, at a spurious frequency higher than the charging frequency, the spurious electromagnetic field has a shallow skin depth, enabling the shield 106 to have a smaller thickness and still be effective at shielding against the spurious electromagnetic field. The skin depth is a distance a wave travels in a medium effective to reduce its amplitude by 36.8%. Reducing the thickness of the shield 106 can further improve the transparency of the shield 106 with respect to the alternating magnetic field 112. A variety of different thicknesses can be used for the shield 106. For example, the thickness may be on the order of micrometers (μm) to millimeters (mm) (e.g., between 0.075 mm and 0.1 mm).

Figure 5:
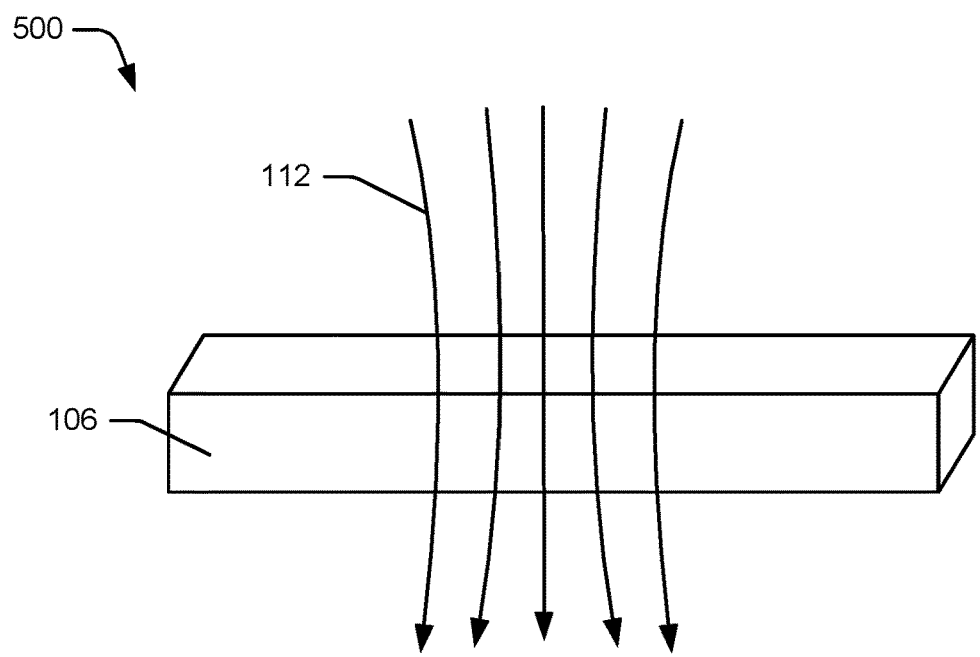
FIG. 5 illustrates an example configuration of the shield shown in FIG. 1 with respect to an alternating magnetic field.

FIG. 5 illustrates an example configuration of the shield 106 with respect to the alternating magnetic field 112 in accordance with one or more aspects at 500. The associated conductivity of the shield 106 is sufficiently low to enable the alternating magnetic field 112 to pass through the shield 106 and charge the receiver device 108 of FIG. 1. The low level of conductivity of the shield 106 reduces or resists the generation of eddy currents at the charging frequency. Most of the eddy currents at the charging frequency are consumed by heat and thus, a counter-magnetic (e.g., opposing) field at the charging frequency is either not generated or only weakly generated. Accordingly, the shield 106 is transparent to the alternating magnetic field 112 and the alternating magnetic field 112 passes through the shield 106 with a minimal amount of attenuation (if any).

Figure 6:
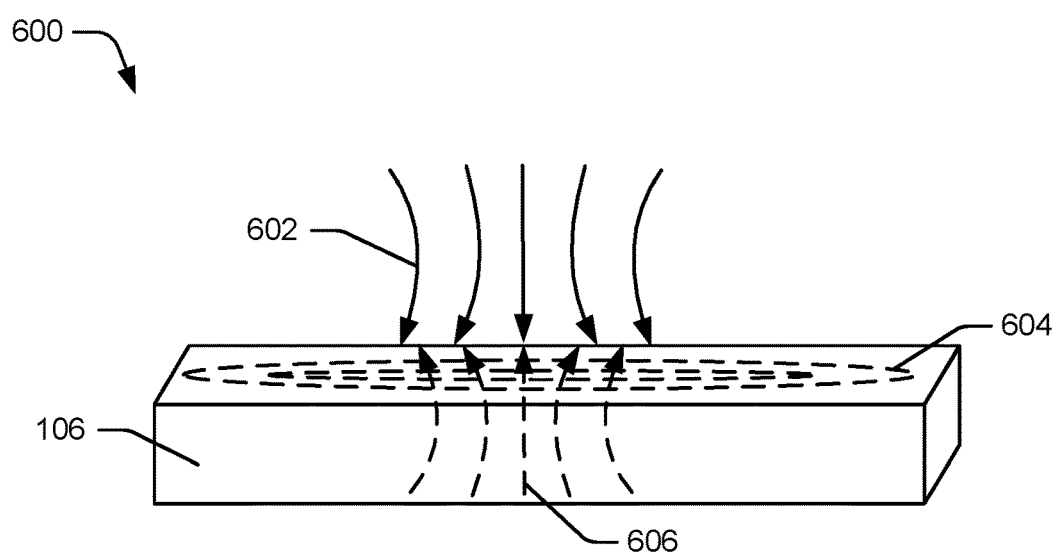
FIG. 6 illustrates an example configuration of the shield shown in FIG. 1 with respect to a spurious electromagnetic field.

FIG. 6 illustrates an example configuration of the shield 106 with respect to a spurious electromagnetic field 602 in accordance with one or more aspects at 600. The associated conductivity of the shield 106 is sufficiently high to prevent the spurious electromagnetic field 602 from passing through the shield 106. The low conductivity of the shield 106 enables the generation of eddy currents 604 at the spurious frequency of the spurious electromagnetic field 602. The eddy currents 604 generate an opposing electromagnetic field 606 at the spurious frequency that cancels the spurious electromagnetic field 602. As a result, the opposing electromagnetic field 606 attenuates the spurious electromagnetic field 602 and reduces an influence of the spurious electromagnetic field 602 on the receiver device 108. Additionally, energy is lost (e.g., power dissipated) in the shield due to the eddy currents 604, which further reduces a strength of the spurious electromagnetic field 602. Accordingly, the shield 106 is lossy to the spurious electromagnetic field 602.

Figure 7:
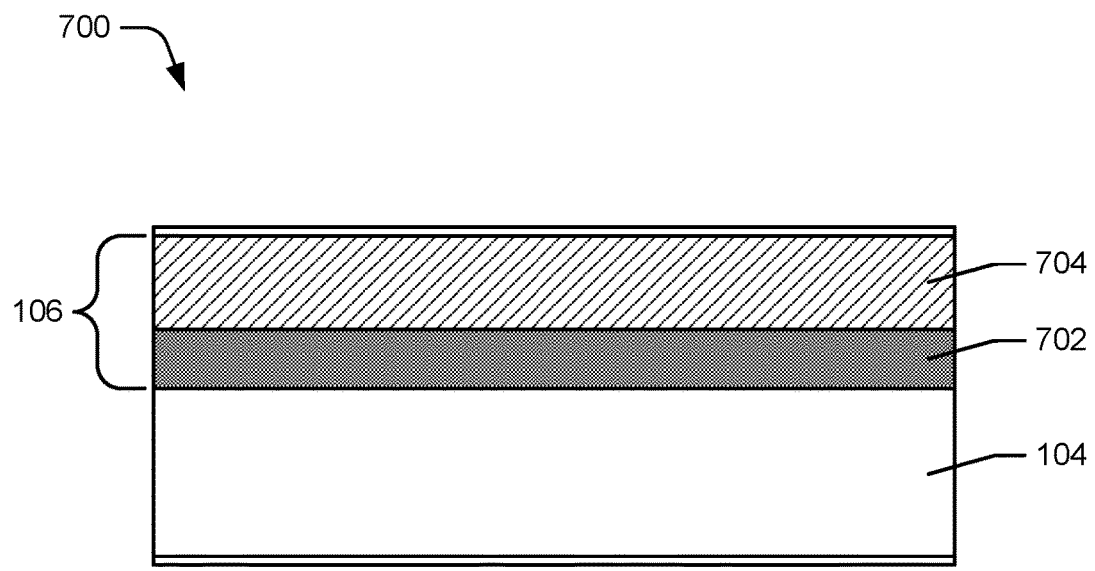
FIG. 7 illustrates an example configuration of the wireless charger shown in FIG. 1 for shielding based on an associated conductivity.

FIG. 7 is an example configuration of the wireless charger 102 in accordance with one or more aspects at 700. The depicted configuration includes the shield 106 positioned on one side of the wireless power transmitter 104. The shield 106 includes a semiconductor layer 702 and a dielectric layer 704, wherein the semiconductor layer 702 is between the dielectric layer 704 and the wireless power transmitter 104. In some aspects, the dielectric layer 704 has a relative permittivity (e.g., dielectric constant) that can further shield the receiver device 108 from the spurious electromagnetic field 402. This allows the performance of the shield 106 to be further tuned based on performance of the semiconductor layer 702, as described in further detail below.

Since electromagnetic coupling is dependent upon a distance between the wireless power transmitter 104 and the receiver device 108, the farther the wireless power transmitter 104 and the receiver device 108 are positioned from one another, the weaker the electromagnetic coupling. In order to increase a distance between the wireless power transmitter 104 and the receiver device 108 without substantially increasing a physical distance between the receiver device 108 and the wireless power transmitter 104, the dielectric layer effectively increases a propagation length between the wireless power transmitter 104 and the receiver device 108 at the spurious frequency. The propagation length increases due to a phase velocity of the spurious electromagnetic field decreasing. The phase velocity is based on both the relative permittivity of the dielectric layer 704 and the spurious frequency of the spurious electromagnetic field. For example, when the spurious frequency is higher than the charging frequency, the spurious electromagnetic field propagates through the dielectric layer 704 with a phase velocity slower than a phase velocity of the alternating magnetic field 112. As a result, the effective distance between the wireless power transmitter 104 and the receiver device 108 is larger for the spurious electromagnetic field than for the alternating magnetic field 112. In addition, the relative permittivity of the dielectric layer 704 can allow the propagation length to be unchanged or minimally increased with respect to the charging frequency of the alternating magnetic field 112. As such, the wireless charging performance is not degraded by the dielectric layer 704.

A variety of different materials can be used to form the dielectric layer 704 having the characteristics described above, such as porcelain, glass, and/or plastics. Additionally, a thickness of the dielectric layer 704 can be on the order of millimeters (mm) (e.g., 0.5 mm, 5 mm).

Figure 8:
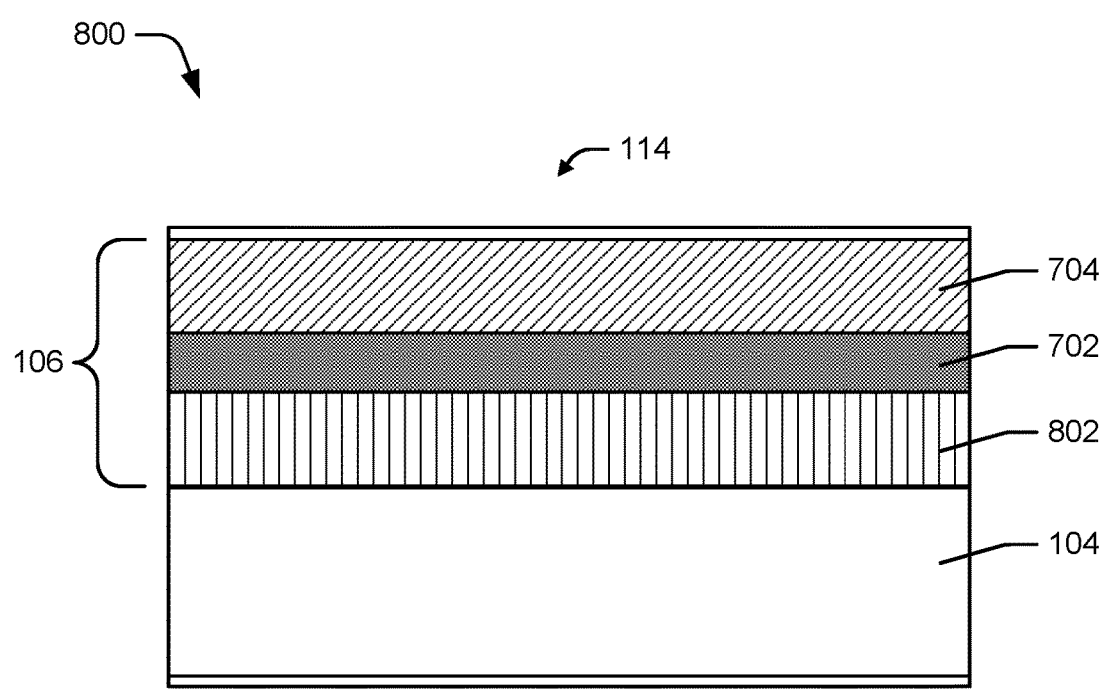
FIG. 8 illustrates another example configuration of the wireless charger shown in FIG. 1 for shielding based on an associated conductivity.

FIG. 8 is another example configuration of the wireless charger 102 in accordance with one or more aspects at 800. The depicted configuration includes the shield 106 positioned on one side of the wireless power transmitter 104. The shield 106 includes the semiconductor layer 702 and the dielectric layer 704 of FIG. 7, and an additional dielectric layer 802. The semiconductor layer 702 is disposed between the dielectric layer 704 and the other dielectric layer 802. The other dielectric layer 802 is configured to provide structural support for the semiconductor layer 702, the dielectric layer 704, and the charging region 114. In some aspects, the other dielectric layer 802 can have a lower relative permittivity than the dielectric layer 704 in order to decrease cost of the wireless charger 102. Alternatively, the other dielectric layer 802 can have a same relative permittivity as the dielectric layer 704.

Shielding Based on an Associated Impedance

Figure 9:
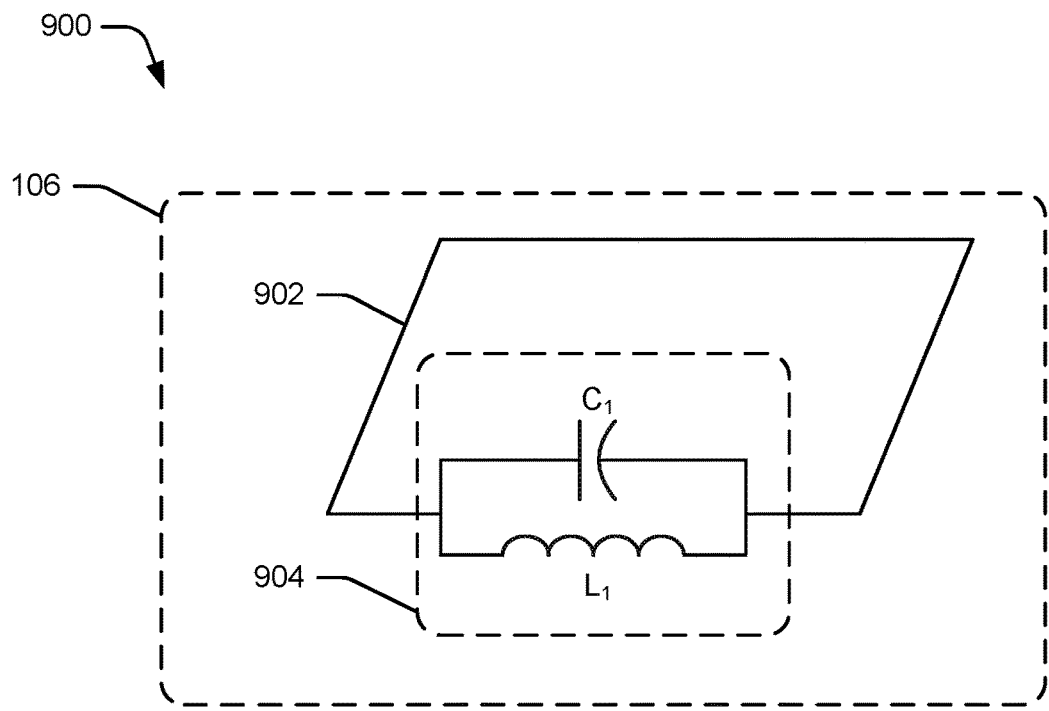
FIG. 9 illustrates an example configuration of the shield shown in FIG. 1 for shielding based on an associated impedance.

FIG. 9 illustrates an example configuration of the shield 106 in accordance with one or more aspects at 900. The shield 106 includes a conductive loop 902 (e.g., coil) connected to a parallel inductor and capacitor circuit 904 (e.g., tank circuit, resonant circuit, tuned circuit). The conductive loop 902 can be composed of copper, aluminum, or iron. Values of an inductance ($L_1$) of an inductor and a capacitance ($C_1$) of a capacitor in the parallel inductor and capacitor circuit 904 are determined in order to set a resonant (e.g., center) frequency ($f_0$) of the parallel inductor and capacitor circuit 904 approximately equal to the charging frequency, using Equation 2 below.

$$f_0 = \frac{1}{2\pi\sqrt{L_1 C_1}} \quad \text{Equation 2}$$

Some implementations can have the conductive loop 902 provide at least a portion of the inductance ($L_1$). Alternatively, the conductive loop 902 can provide the inductance ($L_1$) such that the shield 106 does not require a discrete inductor component.

In order to achieve the shielding performance described above, an associated impedance of the shield 106 is high at the charging frequency effective to enable the shield 106 to be transparent at the charging frequency. In particular, the impedance of the shield 106 is higher at the charging frequency because the charging frequency is approximately equal to the resonant frequency of the parallel inductor and capacitor circuit 904. This enables the parallel inductor and capacitor circuit 904 to act as an open circuit. The high impedance of the shield 106 can resist and/or minimize the generation of eddy currents in the shield 106 at the charging frequency, similar to the techniques for shielding based on the associated conductivity. Accordingly, the shield 106 is transparent to the alternating magnetic field 112 and the alternating magnetic field 112 passes through the shield 106 with a minimal amount of attenuation (if any).

In contrast, the associated impedance of the shield 106 is sufficiently low at the spurious frequency to prevent the spurious electromagnetic field from passing through the shield 106. The lower impedance of the shield 106 at the spurious frequency is effective to enable eddy currents to be generated in the shield 106. The eddy currents travel through the conductive loop and the parallel inductor and capacitor circuit and generate an opposing counter-electromagnetic field that attenuates the spurious electromagnetic field at the spurious frequency. As a result, the opposing counter electromagnetic field attenuates the spurious electromagnetic field and reduces an influence of the spurious electromagnetic field on the receiver device 108. Additionally, energy is lost (e.g., power dissipated) in the shield due to the eddy currents, which further reduces a strength of the spurious electromagnetic field. Accordingly, the shield 106 is lossy to the spurious electromagnetic field.

The parallel inductor and capacitor circuit 904 can also be described as a band-stop filter having a center frequency approximately equal to the charging frequency because the parallel inductor and capacitor circuit 904 prevents currents from generating at the charging frequency and enables currents to generate at the spurious frequency. As such, the alternating magnetic field 112 and the spurious electromagnetic field can be present at the same time and the associated impedance of the shield 106 enables the shield 106 to be simultaneously transparent to the alternating magnetic field 112 and lossy to the spurious electromagnetic field.

Although not depicted, the inductor and the capacitor can alternatively be connected in series to form a series inductor and capacitor circuit that is connected to the conductive loop 902. In this configuration, the resonant frequency can be tuned for the spurious frequency. Similar to the parallel inductor and capacitor circuit 904, the series inductor and capacitor circuit has a higher impedance at the charging frequency and a lower impedance at the spurious frequency. This is because at the spurious frequency, the series inductor and capacitor circuit acts like a short circuit. Thus, other implementations of the inductor and the capacitor can also be realized to enable the shield 106 to be simultaneously transparent to the alternating magnetic field 112 and lossy to the spurious electromagnetic field.

Figure 10:
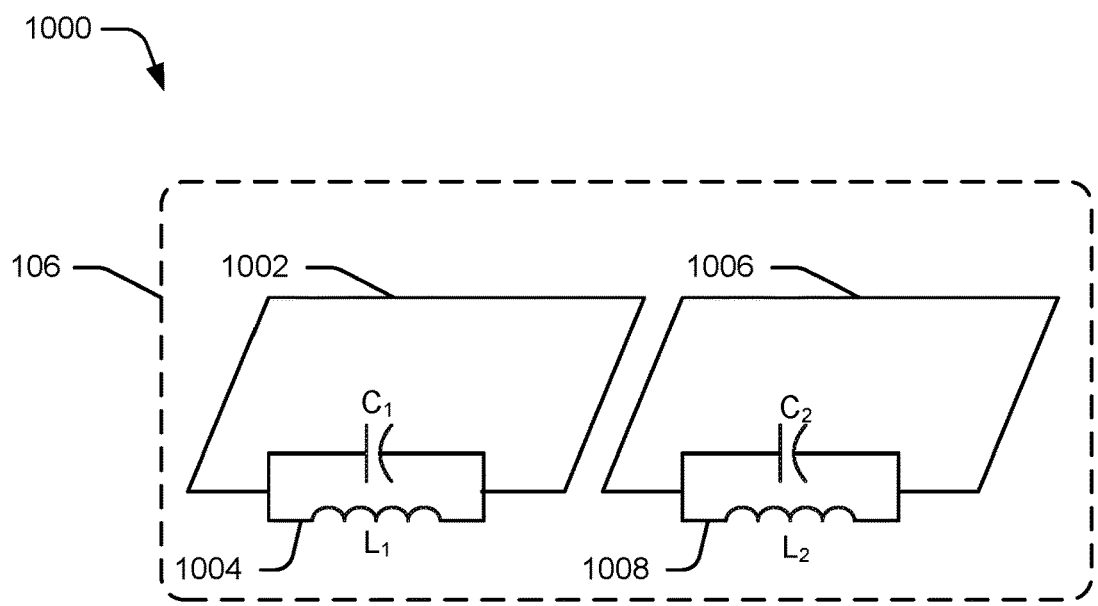
FIG. 10 illustrates another example configuration of the shield shown in FIG. 1 for shielding based on an associated impedance.

FIG. 10 illustrates another example configuration of the shield 106 in accordance with one or more aspects at 1000. In the depicted configuration, the shield 106 includes a first conductive loop 1002 connected to a first parallel inductor and capacitor circuit 1004 and a second conductive loop 1006 connected to a second parallel inductor and capacitor circuit 1008. A size of the first and second coils can be the same or different. Additionally, the size and a position of the first and the second coils can be determined in order to effectively shield the wireless communication device from the spurious field across the charging region 114. Although two conductive coils and parallel inductor and capacitor circuits are depicted, additional conductive coils and parallel inductor and capacitor circuits can be used, such as three or four. The two conductive coils and parallel inductor and capacitor circuits can be on a same plane (e.g. coplanar, on a same layer) or on different planes. In some aspects, a resonant frequency of the first parallel inductor and capacitor circuit 1004 can be different than a resonant frequency of the second parallel inductor and capacitor circuit 1008, in order to enable multiple charging frequencies for wireless charging.

Figure 11:
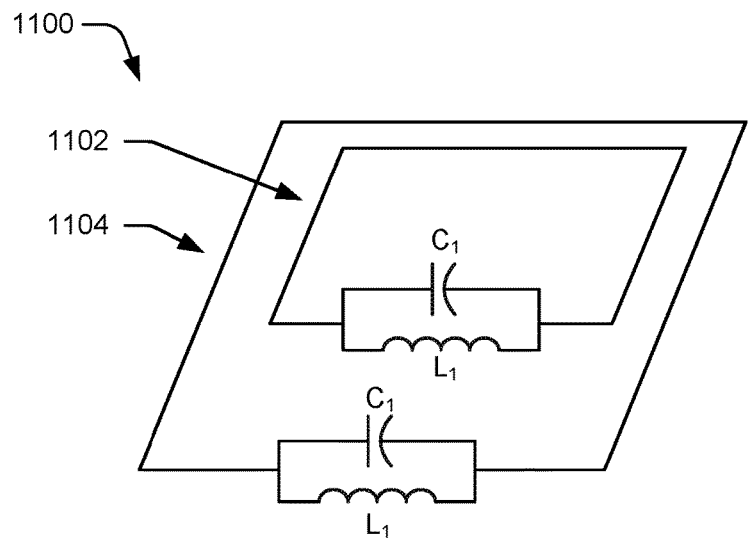
FIG. 11 illustrates yet another example configuration of the shield shown in FIG. 1 for shielding based on an associated impedance.

FIG. 11 illustrates another example configuration of the shield 106 in accordance with one or more aspects at 1100. The shield 106 includes a first module 1102 having a first conductive loop connected to a first parallel inductor and capacitor circuit and a second module 1104 having a second conductive loop connected to a second parallel inductor and capacitor circuit. In the depicted configuration, the first module 1102 is positioned inside the second module 1104. The first module 1102 and the second module 1104 can be concentric. The first module 1102 and the second module 1104 can be located on a same plane or on different planes. By having multiple modules overlapping, the shield 106 can increase an attenuation of the spurious electromagnetic field. The first module 1102 and the second module 1104 can also be configured to attenuate a different range of spurious frequencies by configuring different cut off frequencies for the first module 1102 and the second module 1104.

Figure 12:
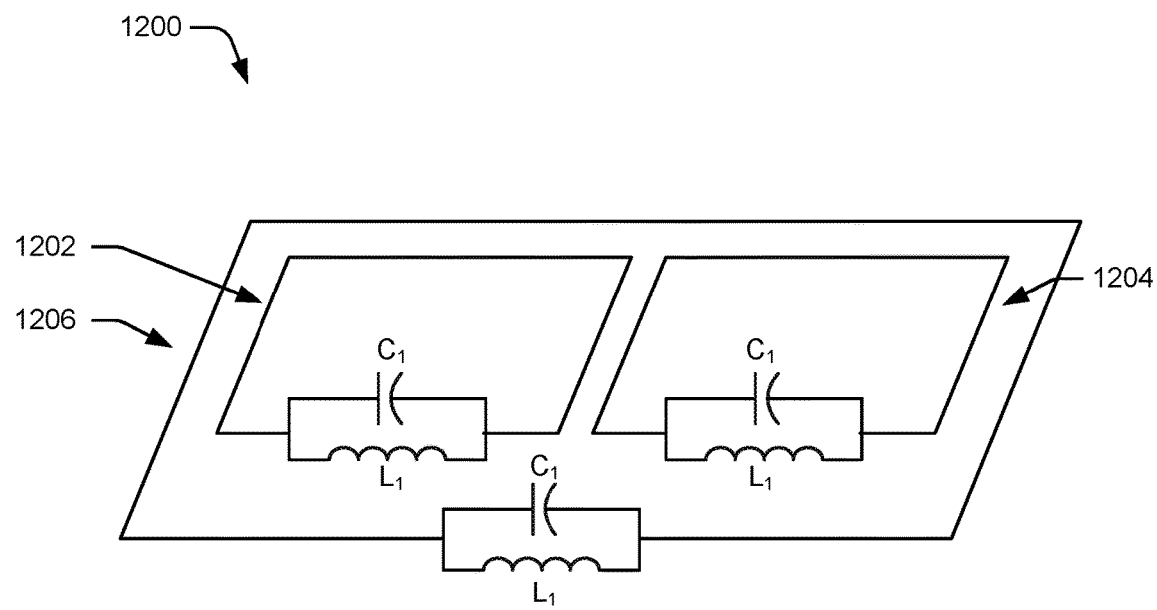
FIG. 12 illustrates another example configuration of the shield shown in FIG. 1 for shielding based on an associated impedance.

FIG. 12 illustrates yet another example configuration of the shield 106 in accordance with one or more aspects at 1200. The shield 106 includes a first module 1202, a second module 1204, and a third module 1206. In the depicted configuration, the first module 1202 and the second module 1204 are positioned inside the third module 1206. In some aspects, the first module 1202 and the second module 1204 can exist on a separate layer above or below the third module 1206.

Example Procedures

The following discussion describes example procedures for shielding wireless power-transmissions. The example procedures may be employed in the wireless charging system 100 of FIG. 1, the system 1700 of FIG. 17, and/or any other suitable environment. The steps described for the various procedures can be implemented automatically and independent of user interaction. The orders in which operations of these procedures are shown and/or described are not intended to be construed as a limitation, and any number or combination of the described procedure operations can be combined in any order to implement a method, or an alternate method.

FIG. 13 depicts a flowchart of an example method 1300 for shielding during wireless charging. At 1302, an alternating magnetic field is generated at a charging frequency to wirelessly transfer power to a receiver device. By way of example, the alternating magnetic field is generated by the wireless power transmitter 104. As a result of the alternating magnetic field, a spurious electromagnetic field is further generated at a spurious frequency different than the charging frequency. At 1304, the spurious electromagnetic field is attenuated while the alternating magnetic field is not substantially attenuated by using a shield having an associated conductivity, such as shield 106 of FIGS. 1 and 3-8. The attenuation of the spurious electromagnetic field is based on the spurious frequency and the associated conductivity of the shield. The non-substantial attenuation of the alternating magnetic field is based on the charging frequency and the associated conductivity of the shield.

Figure 14:
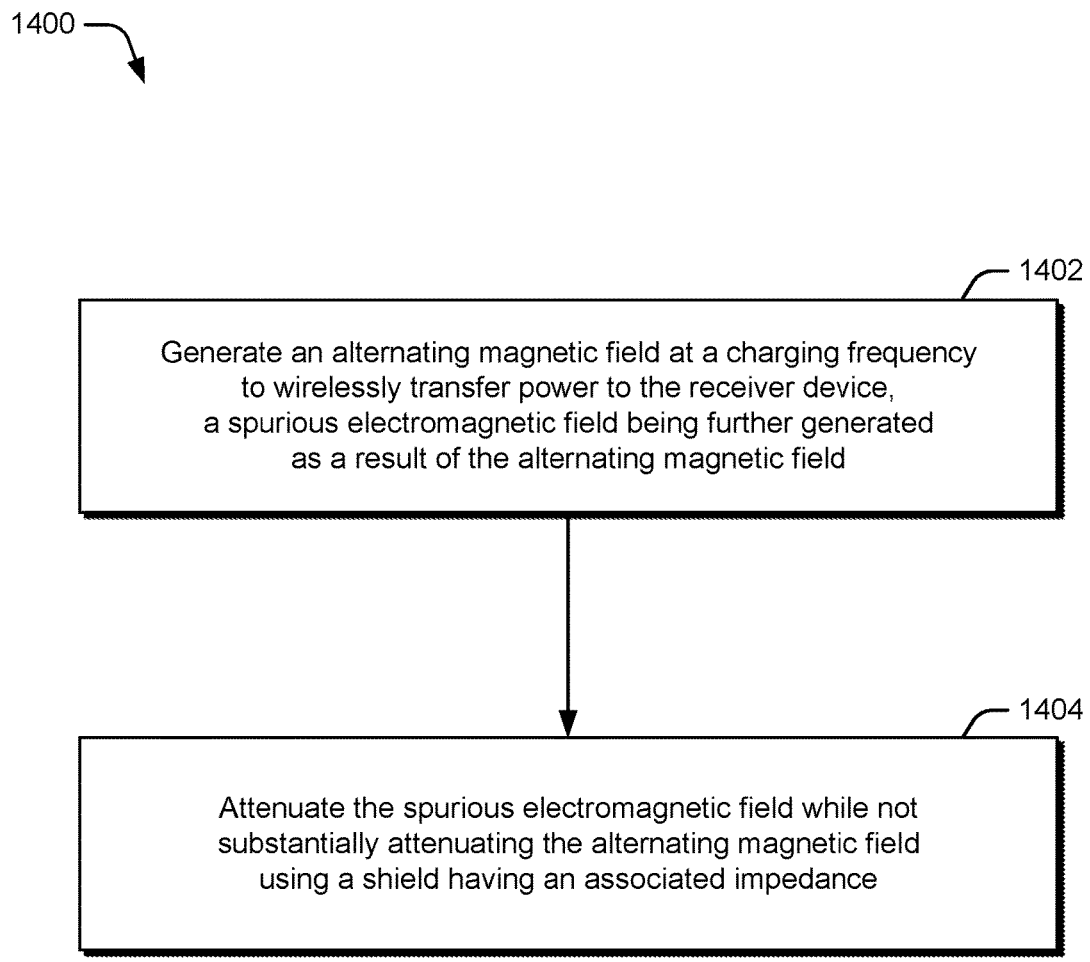
FIG. 14 depicts a flowchart of an example method for wireless power-transmission shielding based on an associated impedance.

FIG. 14 depicts a flowchart of an example method 1400 for shielding during wireless charging. At 1402, an alternating magnetic field is generated at a charging frequency to wirelessly transfer power to a receiver device. By way of example, the alternating magnetic field is generated by the wireless power transmitter 104. As a result of the alternating magnetic field, a spurious electromagnetic field is further generated at a spurious frequency different than the charging frequency. At 1404, the spurious electromagnetic field is attenuated while the alternating magnetic field is not substantially attenuated by using a shield having an associated impedance, such as shield 106 of FIGS. 1, 3, 4, and 9-12. The attenuation of the spurious electromagnetic field is based on the spurious frequency and the associated impedance of the shield. The non-substantial attenuation of the alternating magnetic field is based on the charging frequency and the associated impedance of the shield.

Figure 15:
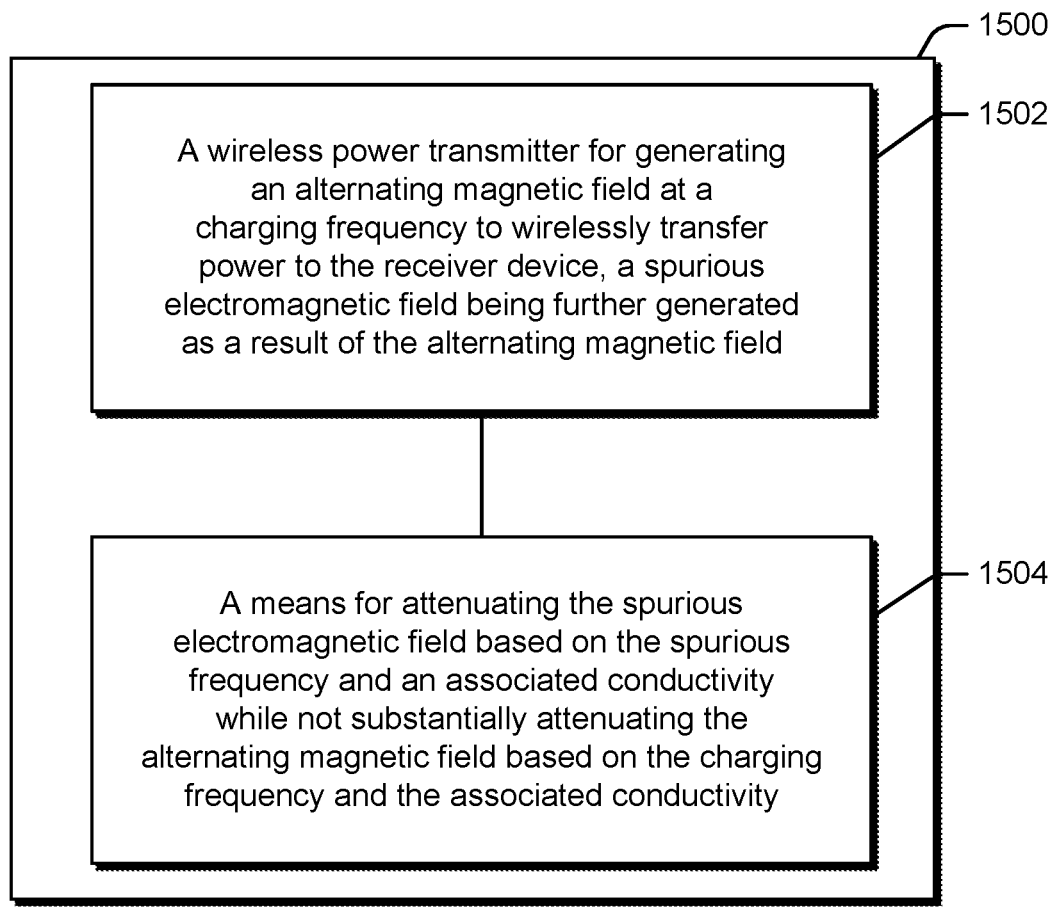
FIG. 15 illustrates an example apparatus having components through which aspects of a wireless power-transmission shield can be implemented of shielding based on an associated conductivity.

FIG. 15 illustrates an example apparatus 1500 having components through which aspects of a wireless power-transmission shield can be implemented. The illustrated apparatus is not intended to be limited to the illustrated components, but may include components that are not shown in FIG. 15. The apparatus 1500 comprises a wireless power transmitter 1502 for generating an alternating magnetic field at a charging frequency to wirelessly transfer power to the receiver device. As a result of the alternating magnetic field, a spurious electromagnetic field is further generated at a spurious frequency different than the charging frequency. The wireless power transmitter 1602 can be configured to perform the functions at 1402 from FIG. 14 and can be implemented by the wireless power transmitter 104 of any of FIGS. 1-4, 7, and 8.

The apparatus 1500 further comprises a means 1504 for attenuating the spurious electromagnetic field based on the spurious frequency and an associated conductivity while not substantially attenuating the alternating magnetic field based on the charging frequency and the associated conductivity. In certain aspects, the means 1504 can be configured to perform the functions at 1304 of FIG. 13 and can be implemented by the shield 106 of any of FIGS. 1 and 3-8.

Figure 16:
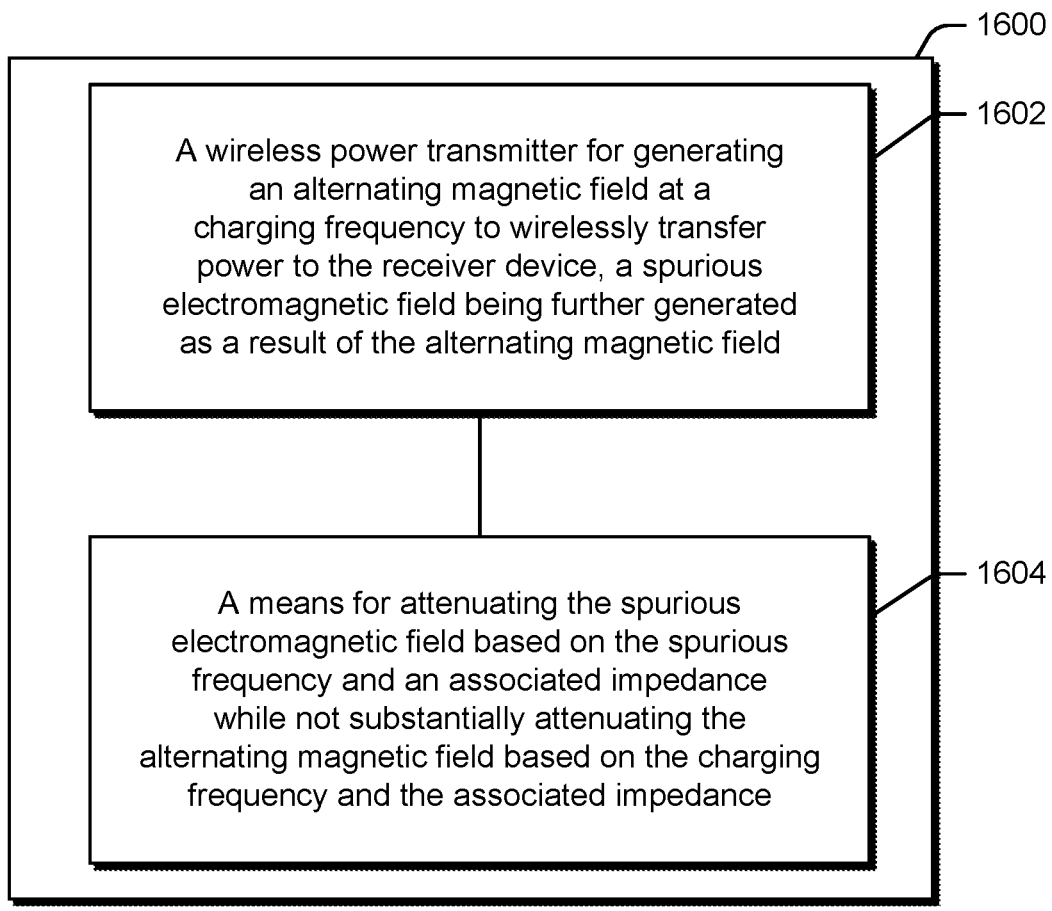
FIG. 16 illustrates an example apparatus having components through which aspects of a wireless power-transmission shield can be implemented with respect to shielding based on an associated impedance.

FIG. 16 illustrates an example apparatus 1600 having components through which aspects of a wireless power-transmission shield can be implemented. The illustrated apparatus is not intended to be limited to the illustrated components, but may include components that are not shown in FIG. 16. The apparatus 1600 comprises a wireless power transmitter 1602 for generating an alternating magnetic field at a charging frequency to wirelessly transfer power to the receiver device. As a result of the alternating magnetic field, a spurious electromagnetic field is further generated at a spurious frequency different than the charging frequency. The wireless power transmitter 1602 can be configured to perform the functions at 1402 from FIG. 14 and can be implemented by the wireless power transmitter 104 of any of FIGS. 1-4, 7, and 8.

The apparatus 1600 further comprises means 1604 for attenuating the spurious electromagnetic field based on the spurious frequency and an associated impedance while not substantially attenuating the alternating magnetic field based on the charging frequency and the associated impedance. In certain aspects, the means 1604 can be configured to perform the functions at 1404 of FIG. 14 and can be implemented by the shield 106 of any of FIGS. 1, 3, 4, and 9-12.

Wireless Power Transfer System

Figure 17:
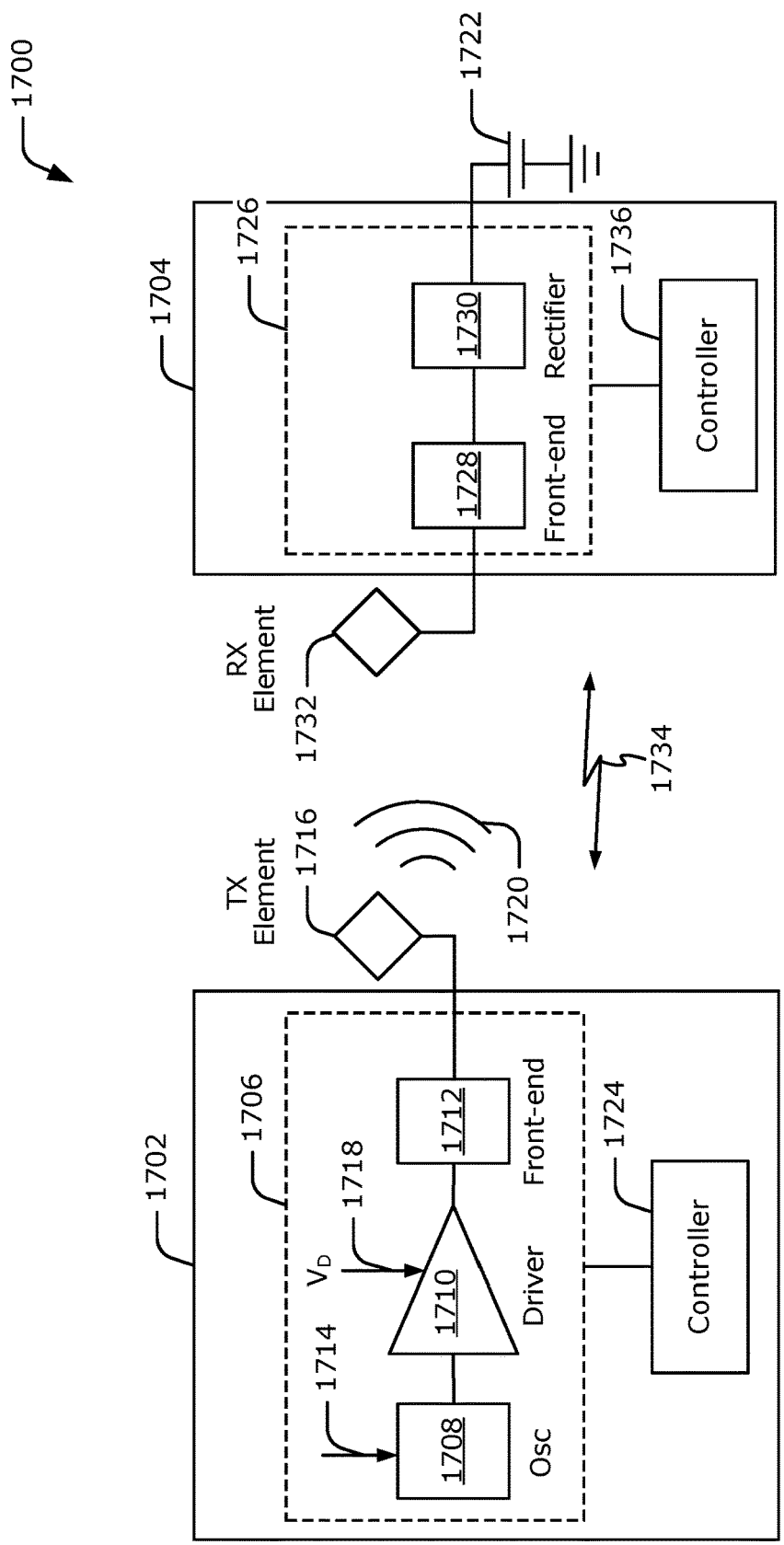
FIG. 17 illustrates an example apparatus having components through which aspects of a wireless power-transmission shield can be implemented.

FIG. 17 illustrates an example wireless power transfer system 1700, which includes components capable of implementing aspects of shielding during wireless charging. The system 1700 includes a transmitter 1702 and a receiver 1704. The transmitter 1702 and the receiver 1704 may correspond to or be included as part of, respectively, the wireless power transmitter 104 and the wireless power receiver 110 that utilize the shield 106 described herein.

The transmitter 1702 may include transmit circuitry 1706 having an oscillator 1708, a driver circuit 1710, and a front-end circuit 1712. The oscillator 1708 may be configured to generate an oscillator signal at a desired frequency that may adjust in response to a frequency control signal 1714. The oscillator 1708 may provide the oscillator signal to the driver circuit 1710. The driver circuit 1710 may be configured to drive the power transmitting element 1716 at, for example, a resonant frequency of the power transmitting element 1716 based on an input voltage signal (VD) 1718. The driver circuit 1710 may be a switching amplifier configured to receive a square wave from the oscillator 1708 and output a sine wave.

The front-end circuit 1712 may include a filter circuit configured to filter out harmonics or other unwanted frequencies. The front-end circuit 1712 may include a matching circuit configured to match the impedance of the transmitter 1702 to the impedance of the power transmitting element 1716. The front-end circuit 1712 may include also a tuning circuit to create a resonant circuit with the power transmitting element 1716. As a result of driving the power transmitting element 1716, the power transmitting element 1716 may generate a wireless field 1720 to wirelessly output power at a level sufficient for charging a battery 1722, or otherwise powering a load.

The transmitter 1702 may further include a controller 1724 operably coupled to the transmit circuitry 1706 and configured to control one or more aspects of the transmit circuitry 1706, or accomplish other operations relevant to managing the wireless transfer and powering the receiver 1704. The controller 1724 may be a micro-controller or a processor. The controller 1724 may be implemented as an application-specific integrated circuit (ASIC). The controller 1724 may be operably connected, directly or indirectly, to each component of the transmit circuitry 1706. The controller 1724 may be further configured to receive information from each of the components of the transmit circuitry 1706 and perform calculations based on the received information. The controller 1724 may be configured to generate control signals (e.g., the control signal 1714) for each of the components that may adjust the operation of that component. As such, the controller 1724 may be configured to adjust or manage the power transfer for powering the receiver 1704. The transmitter 1702 may further include a memory (not shown) configured to store data, for example, such as instructions for causing the controller 1724 to perform particular functions, such as those related to management of wireless power transfer.

The receiver 1704 may include receive circuitry 1726 having a front-end circuit 1728 and a rectifier circuit 1730. The front-end circuit 1728 may include matching circuitry configured to match the impedance of the receive circuitry 1726 to the impedance of the power receiving element 1732. The front-end circuit 1728 may further include a tuning circuit to create a resonant circuit with the power receiving element 1732. The rectifier circuit 1730 may generate a DC power output from an AC power input to charge the battery 1722, or provide power to some other load. The receiver 1704 and the transmitter 1702 may additionally communicate on a separate communication channel 1734, e.g., Bluetooth™, ZigBee™, and cellular. The receiver 1704 and the transmitter 1702 may alternatively communicate via in-band signaling using characteristics of the wireless field 1720.

Further, the receiver 1704 may be configured to determine whether an amount of power transmitted by the transmitter 1702 and received by the receiver 1704 is appropriate for charging the battery 1722 or powering a load. In certain aspects, the transmitter 1702 may be configured to generate a predominantly non-radiative field with a direct field coupling coefficient (k) for providing energy transfer. The receiver 1704 may directly couple to the wireless field 1720 and may generate an output power for storing or consumption by the battery 1722 (or load), coupled to the output of the receive circuitry 1726.

The receiver 1704 may further include a controller 1736 configured similarly to the transmit controller 1724 as described above for one or more wireless power management aspects of the receiver 1704. The receiver 1704 may further include a memory (not shown) configured to store data, such as instructions for causing the controller 1736 to perform particular functions, such as those related to management of wireless power transfer. The transmitter 1702 and receiver 1704 may be separated by a distance and configured according to a mutual resonant relationship to minimize transmission losses between the transmitter 1702 and the receiver 1704.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed

What is claimed is:

1. A wireless charger comprising:
   a wireless power transmitter configured to generate an alternating magnetic field at a charging frequency to wirelessly transfer power to a receiver device, a spurious electromagnetic field being further generated as a result of the alternating magnetic field, the spurious electromagnetic field being generated at a spurious frequency different than the charging frequency; and
   a shield having an associated conductivity and disposed between the wireless power transmitter and a charging region, the shield configured to:
      generate eddy currents at the charging frequency, the eddy currents being at a first level based on the associated conductivity; and
      generate other eddy currents at the spurious frequency, the other eddy currents being at a second level that is higher than the first level based on the associated conductivity,
      the shield being substantially transparent to the alternating magnetic field based on the first level and lossy to the spurious electromagnetic field based on the second level.

2. The wireless charger of claim 1, wherein the shield is configured to generate, based on the other eddy currents, an opposing electromagnetic field at the spurious frequency to cancel the spurious electromagnetic field.

3. The wireless charger of claim 1, wherein the associated conductivity of the shield is between 0.00001 and 100 Siemens per meter.

4. The wireless charger of claim 3, wherein the associated conductivity of the shield is between 0.0001 Siemens per meter and 10 Siemens per meter.

5. The wireless charger of claim 1, wherein the shield includes a continuous and homogeneous semiconductor layer.

6. The wireless charger of claim 5, wherein the continuous semiconductor layer comprises an anti-static sheet.

7. The wireless charger of claim 5, wherein the continuous semiconductor layer comprises silicon.

8. The wireless charger of claim 1, wherein the shield is non-magnetic with a relative permeability of one.

9. The wireless charger of claim 1, wherein a thickness of the shield is between 0.01 millimeters and 10 millimeters.

10. The wireless charger of claim 9, wherein the thickness of the shield is between 0.05 millimeters and 0.1 millimeters.

11. The wireless charger of claim 1, wherein the spurious frequency is higher than the charging frequency.

12. The wireless charger of claim 1, wherein:
the shield includes a first semiconductor layer and a second semiconductor layer;
the first semiconductor layer is positioned on a first side of the wireless power transmitter; and
the second semiconductor layer is positioned on a second side of the wireless power transmitter that is opposite the first side.

13. The wireless charger of claim 1, wherein the charging frequency is between 3 MHz and 10 MHz and the spurious frequency is greater than 12 MHz.

14. The wireless charger of claim 1, wherein the charging region is a planar surface on the wireless charger and wherein the shield includes a dielectric layer configured to provide structural support for the charging region.

15. The wireless charger of claim 1, wherein the shield includes a dielectric layer configured to reduce electromagnetic coupling between the wireless power transmitter and the receiver device at the spurious frequency based on a dielectric constant of the dielectric layer.

16. A system for wirelessly charging a receiver device, comprising:
a wireless power transmitter configured to wirelessly transfer power to the receiver device through generation of an alternating magnetic field at a charging frequency, a spurious electromagnetic field being further generated as a result of the alternating magnetic field, the spurious electromagnetic field having a spurious frequency different than the charging frequency; and
a shield having an associated impedance and disposed between the wireless power transmitter and a charging region, the shield configured to:
generate eddy currents at the charging frequency, the eddy currents being at a first level based on the associated impedance; and
generate other eddy currents at the spurious frequency, the other eddy currents being at a second level that is higher than the first level based on the associated impedance,
the shield being substantially transparent to the alternating magnetic field based on the first level and lossy to the spurious electromagnetic field based on the second level.

17. The system of claim 16, wherein the shield is configured to generate, based on the other eddy currents, an opposing electromagnetic field at the spurious frequency to cancel the spurious electromagnetic field.

18. The system of claim 16, wherein the shield includes a capacitor connected to a conductive loop.

19. The system of claim 18, wherein a capacitance of the capacitor is effective to configure a resonant frequency of the shield to be equal to the charging frequency.

20. The system of claim 19, wherein:
the shield includes an inductor that is coupled in parallel with the capacitor; and
an inductance of the inductor and the capacitance of the capacitor are effective to configure the resonant frequency of the shield to be equal to the charging frequency.

21. The system of claim 18, wherein the shield includes another capacitor connected to another conductive loop.

22. The system of claim 21, wherein the conductive loop is positioned inside the other conductive loop.

23. A method for wirelessly charging a receiver device, comprising:
generating an alternating magnetic field at a charging frequency to wirelessly transfer power to the receiver device, a spurious electromagnetic field being further generated as a result of the alternating magnetic field, the spurious electromagnetic field being generated at a spurious frequency different than the charging frequency;
generating, within a shield, eddy currents at the charging frequency, the eddy currents being at a first level based on an associated conductivity of the shield;
generating, within the shield, other eddy currents at the spurious frequency, the other eddy currents being at a second level that is higher than the first level based on the associated conductivity of the shield; and
attenuating the spurious electromagnetic field while not substantially attenuating the alternating magnetic field using the shield, the attenuating of the spurious electromagnetic field based on the second level of the other eddy currents, the not substantially attenuating of the alternating magnetic field based on the first level of the eddy currents.

24. The method of claim 23, wherein the attenuating of the spurious electromagnetic field is effective to reduce interference for the receiver device at the spurious frequency while the not substantially attenuating the alternating magnetic field is effective to wirelessly charge the receiver device at the charging frequency.

25. The method of claim 23, wherein the attenuating of the spurious electromagnetic field is at least three decibels and the not substantially attenuating of the alternating magnetic field is less than one decibel.

26. The method of claim 23, wherein the charging frequency is between 3 MHz and 10 MHz and the spurious frequency is greater than 12 MHz.

27. The method of claim 23, wherein the associated conductivity is a low conductivity associated with a semiconductor.

28. An apparatus for wirelessly charging a receiver device, comprising:
a wireless power transmitter for generating an alternating magnetic field at a charging frequency to wirelessly transfer power to the receiver device, a spurious electromagnetic field being further generated as a result of the alternating magnetic field, the spurious electromagnetic field being generated at a spurious frequency different than the charging frequency; and
means for attenuating the spurious electromagnetic field based on the spurious frequency and an associated impedance or associated conductivity while not substantially attenuating the alternating magnetic field based on the charging frequency and the associated impedance or the associated conductivity, the means for attenuating the spurious electromagnetic field comprising:

means for generating eddy currents at the charging frequency, the eddy currents being at a first level based on the associated impedance or the associated conductivity; and means for generating other eddy currents at the spurious frequency, the other eddy currents being at a second level that is higher than the first level based on the associated impedance or the associated conductivity.

29. The apparatus of claim 28, wherein the associated impedance is higher based on the charging frequency and lower based on the spurious frequency, while the associated conductivity is higher based on the spurious frequency and lower based on the charging frequency.

30. The apparatus of claim 28, wherein the attenuating of the spurious electromagnetic field is at least three decibels and the not substantially attenuating the alternating magnetic field is less than one decibel.

* * * * *